(12) United States Patent
Nieves

(10) Patent No.: US 6,910,265 B2
(45) Date of Patent: Jun. 28, 2005

(54) AIR SUCTION COMPONENT PLACEMENT NOZZLE

(75) Inventor: Miguel A. Nieves, Escondido, CA (US)

(73) Assignee: Kyocera Wireless Corp., San Diego, CA (US)

( * ) Notice: Subject to any disclaimer, the term of this patent is extended or adjusted under 35 U.S.C. 154(b) by 342 days.

(21) Appl. No.: 10/112,494

(22) Filed: Mar. 28, 2002

(65) Prior Publication Data

US 2003/0182796 A1 Oct. 2, 2003

(51) Int. Cl.[7] .................................................. H05K 3/30
(52) U.S. Cl. .............................. 29/832; 29/828; 29/834; 29/836; 29/839; 29/743
(58) Field of Search ........................... 29/743, 760, 832, 29/840; 294/64.1; 414/403, 416.01; 439/600

(56) References Cited

U.S. PATENT DOCUMENTS

| | | | | |
|---|---|---|---|---|
| 4,349,189 A | * | 9/1982 | Edstrom ..................... 198/456 |
| 5,524,284 A | * | 6/1996 | Marcou et al. .......... 455/575.7 |
| 5,533,253 A | * | 7/1996 | Mifuji ......................... 29/741 |
| 6,068,517 A | * | 5/2000 | Tanaka ....................... 439/660 |

* cited by examiner

*Primary Examiner*—Minh Trinh
*Assistant Examiner*—Donghai D. Nguyen

(57) ABSTRACT

A pick and place system comprises a pick and place nozzle. The nozzle includes a groove comprising tapered sides that feed into a depression at the bottom of the groove, and a plurality of air holes configured to allow air suction to attract a component and hold it in the groove in such a manner as to ensure that the component can be accurately placed. The system also comprises a tray configured to hold a plurality of components to be picked up and placed using the pick and place nozzle. The tray can be configured to hold the components in a precise location within the tray.

7 Claims, 3 Drawing Sheets

AIR SUCTION COMPONENT PLACEMENT NOZZLE

BACKGROUND OF THE INVENTION

1. Field of the Invention

The invention relates generally to the assembly of integrated circuit boards, and particularly to improved methods for picking and placing oddly shaped components using a pick and place machine.

2. Background

In high volume circuit board assembly, a pick and place machine is typically used to pick up and place components onto circuit boards. The components are placed onto solder pads that are covered with solder paste. After the components are placed, the circuit board is heated, which melts the solder and attaches the component to the board. The components typically come in reels. Components that are too large or that are oddly shaped, and therefore cannot be taped and reeled, are typically placed in trays.

In order for the pick and place machine to pick up the components, there must be some way for the machine to "see" them. Without going into detail, a conventional pick and place machine usually includes a camera that allows it to see the parts after pick them up. The location of the corresponding solder pads can then be programmed into the machine so that it will "know" where to place a component once it has picked it up.

The process just described is generally used whether the components are in trays or on reels. The camera must be able to see all or substantially all of the component in order to allow the machine to place it on the solder pads. If a component is so large that it extends beyond the field of view of the camera used to see the component, then the process does not work very well. This is because, the pick and place machine is typically configured to locate a component by locating the center of the component. The center is usually determined with reference to the edge or outside dimensions of the component. Thus, if a component does not fit within the field of view of the camera, then the camera will not be able to locate the center, because it will not be able to reference the edges of the component, and the pick and place machine will not be able to pick up the component.

This problem is prevalent, for example, in the assembly of circuit boards for mobile phones. In particular, many mobile phones include a Radio Frequency (RF) test port that "picks-off" RF signal generated by the mobile phone just before they reach the antenna. This, for example, allows a technician to test the performance of the phone. A low loss transmission line is needed to connect the test port to the pick-off point, which is near the antenna. A piece of coaxial cable is typically used as the transmission line. The cable can be several centimeters to several inches. Thus, the cable often extends well beyond the field of view of the camera, which means the center of the cable cannot be locate efficiently.

As a result, it is difficult to use conventional pick and place machines to place such cables. It should be clear, however, that the same or similar problem attaches whenever a component is of such dimension that it makes it difficult for the pick and place machine to locate the center of the component.

The conventional solution to this problem is to hand place the components onto the circuit board. The hand placed components can then be solder onto the board by hand after all the other parts have been attached via the heating process described above, or the component can be hand placed and then attached via the heating process along with the rest of the components.

Hand placing such components, however, has severe drawbacks, namely an increase in the cost of production, because hand placing components is time consuming. Conventional pick and place machines can place thousands of parts very quickly and very accurately. Whereas hand placing parts is a much slower and more methodical process. But in high volume production, even minor slow downs can be very costly in monetary terms. Further, it takes extra personal to hand place the parts, which also drives up costs significantly.

Alternatively, The cable can be manufactured with connectors on each end. Mating connectors can then be placed and soldered onto the board using a conventional pick and place machine. The cable can then be attached by hand using the connectors. While this may save some assembly time, it still drives up labor costs and increases the cost of the cable and the circuit board due to the added connectors.

The bottom line is that it is not only inefficient to have to hand place components in a high volume assembly process—it is also very costly.

SUMMARY OF THE INVENTION

In order to overcome the problems associated with conventional pick and place machines, the systems and methods described herein allow for automated placement of oddly shaped parts that a conventional pick and place machine would not be able to accurately place. This is done by designing a customized nozzle that will allow a pick and place machine to pick up the oddly shaped component in such a manner that accurate placement with regard to some or all of the relevant axis is ensured.

To further aid accurate placement, the trays or reels that hold the components can be designed to hold the components in exact locations within the trays, i.e., in a certain location plus-or-minus a certain tolerance. In addition, the solder pads for the parts can be designed to allow slightly more positional tolerance so that the required placement accuracy is not as severe.

By combining some or all of these techniques, accurate automated placement of components previously unplaceable by conventional pick and place machines can be achieved.

Other aspects, advantages, and novel features of the invention will become apparent from the following Detailed Description of Preferred Embodiments, when considered in conjunction with the accompanying drawings.

BRIEF DESCRIPTION OF THE DRAWINGS

Preferred embodiments of the present inventions taught herein are illustrated by way of example, and not by way of limitation, in the figures of the accompanying drawings, in which.

DETAILED DESCRIPTION OF THE PREFERRED EMBODIMENTS

Figure 1:
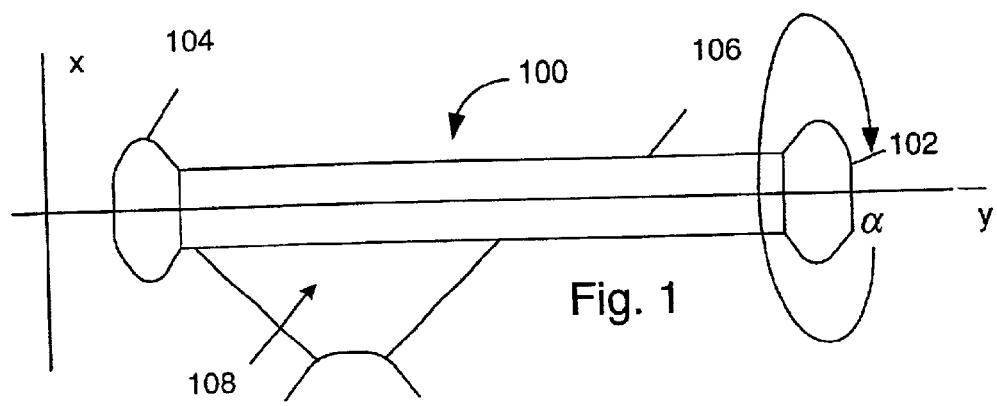
FIG. 1 is a diagram illustrating an exemplary cable that is unplaceable using a conventional pick and place machine.

FIG. 1 is a diagram illustrating a cable 100 that is too long to fit in the field of view 108 of a camera used by a conventional pick and place machine. Because cable 100 extends beyond the field of view 108 of the camera, a conventional pick and place machine will have no way to accurately determine of it has located the center of cable 100. Thus, a conventional pick and place machine will not be able to accurately place cable 100 onto the associated solder pads. Mainly, the inability to locate the center of cable 100 will make it difficult to accurately place cable 100 with respect to the y-axis, because errors in the location of the center will occur with respect to this axis. As a result, ends 102 and 104 of cable 100 must be hand connected or solder in a conventional manufacturing processes.

Y-axis errors are not the only placement errors that can occur. Generally, cable 100 will have three degrees of freedom along the x-axis, y-axis, and the rotational axis ($\alpha$). Thus, placement errors can occur along any of these axis, or degrees of freedom. In fact, cables, such as cable 100, are also highly prone to rotational ($\alpha$) errors, because conventional pick and place machines are not capable of preventing the cables from rotating once they have been picked up.

Figure 2:
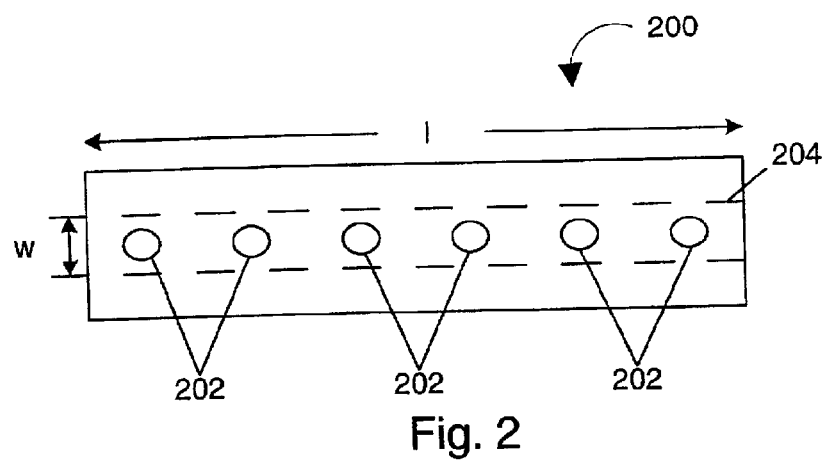
FIG. 2 is a diagram illustrating one embodiment of a nozzle that can be used to pick up and accurately place the cable of FIG. 1 using a pick and place machine in accordance with the invention.

To combat such problems, the systems and methods described herein employ a special nozzle 200, illustrated in FIG. 2, which is designed to allow a conventional pick and place machine to pick up cable 100 and accurately place it with respect to all three axis. Nozzle 200 comprises a groove 204 configured to fit around cable 100. Thus, groove 204 comprises a width (w) sufficient to allow cable 100 to fit within groove 204. Aspects of the groove are discussed more fully with respect to FIG. 3. Nozzle 200 also preferably includes holes 202 along groove 204. Holes 202 allow nozzle 200 to pick up cable 100 using air suction. An air hose (not shown) can be coupled to nozzle 200 in order to create the suction. Cable 100 is then picked up once it is in groove 204 using the suction created through holes 202.

Nozzle 200 also comprises a length (l). It is important that the entire length of cable 100 is picked up simultaneously and that the entire length be placed simultaneously. If one end is picked up or placed before the other, then the accuracy of the placement may be degraded. Thus, the length (l) and number of holes 202 are preferably selected so that the entire length of cable 100 will be picked up and placed simultaneously.

Figure 3:
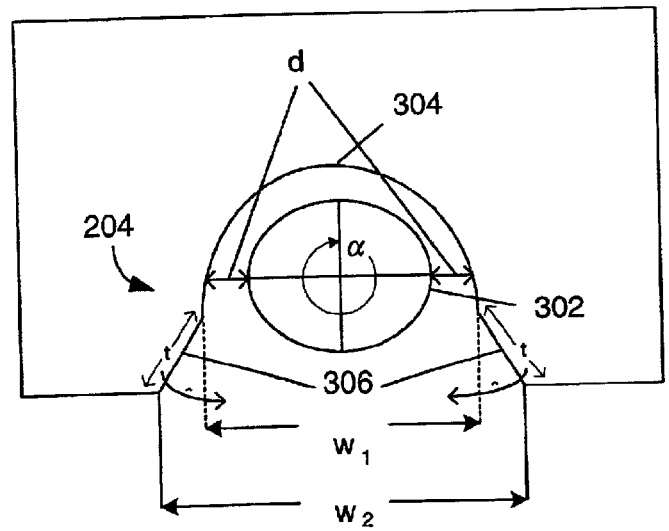
FIG. 3 is a diagram illustrating an end view of he nozzle in FIG. 2.

FIG. 3 illustrates an end view of nozzle 200 in which critical aspects and dimensions of groove 204 are detailed. First, as can be seen, groove 204 preferably comprises tapered sides 306, which are configured to feed cable 100 down into semi-circular depression 304 at the bottom of groove 204, where it can be picked up using suction through holes 202. Thus, the width of groove 204 is increased, for purposes of picking up cable 100, from $w_1$ to $w_2$ as illustrated in FIG. 3. The increase in width is beneficial because it provides more tolerance when picking up cable 100, i.e., nozzle 200 does not need to be as precisely placed over cable 100 in order to ensure that cable 100 will make it into groove 204. The angle ($\beta$) and length (t) of tapered sides 306 are preferably selected so that sides 306 effectively act to funnel cable 100 down into depression 304 at the bottom of groove 204.

The width ($w_1$) of depression 304, which can be equal to the radius of the semi-circle that forms depression 304, must be selected to ensure that cable 100 will fit within depression 304. But $w_1$ is also preferably selected to ensure that cable 100 will not slide along the length (l) of groove 204 or rotate once in groove 204. For example, testing has revealed that for at least some types of cable, the space (d) on each side of cable 100 when it is in groove 204 is preferably 0.05 mm. For the cables tested, this distance (d) proved adequate for maintaining the y-axis and rational ($\alpha$) positions of cable 100 within groove 204, which in turn ensures accurate placement on the solder pads in relation to the y-axis and rotational ($\alpha$) positions.

The overall width ($w_1$) of depression 304 should also be sufficiently narrow to ensure that the x-axis position of cable 100 will also be within the required tolerances. In other words, if $w_1$ is too large, then cable 100 may move from side to side within depression 304, which may result in inaccurate placement on the solder pads in relation to the x-axis. Therefore, $w_1$ should be made wide enough to accommodate cable 100, but narrow enough to prevent cable 100 from moving too much once it is in depression 304.

Thus, including tapered sides 306 increases the tolerance for picking up cable 100, while the width ($w_1$) of depression 304 helps ensure accurate placement of cable 100 in all three axis of interest. And by configuring nozzle 200 to work with a conventional pick and place machine, such a machine can be configured to automatically place cable 100 and eliminate the extra step of hand placing and/or soldering cable 100.

Preferably, the surface of depression 304 is configured to create some amount of friction between the surface and cable 100. The added friction helps to prevent sliding and rotating of cable 100. Thus, in one embodiment for example, nozzle 200 is made from stainless steel that is coated to create a somewhat rough surface. The rough surface then helps to create friction between nozzle 200 and cable 100.

Additionally, the tray or tape from which cable 100 is picked up can also be configured to ensure that cable 100 is accurately placed. For example, in one embodiment, a tray for holding a plurality of cables 100 is configured such that each cable is precisely located within the tray to a tolerance of +/−0.3 mm. This helps ensure that cable 100 will be precisely located in groove 204, which in turn ensures that cable 100 will be precisely placed on the circuit board.

Figure 4:
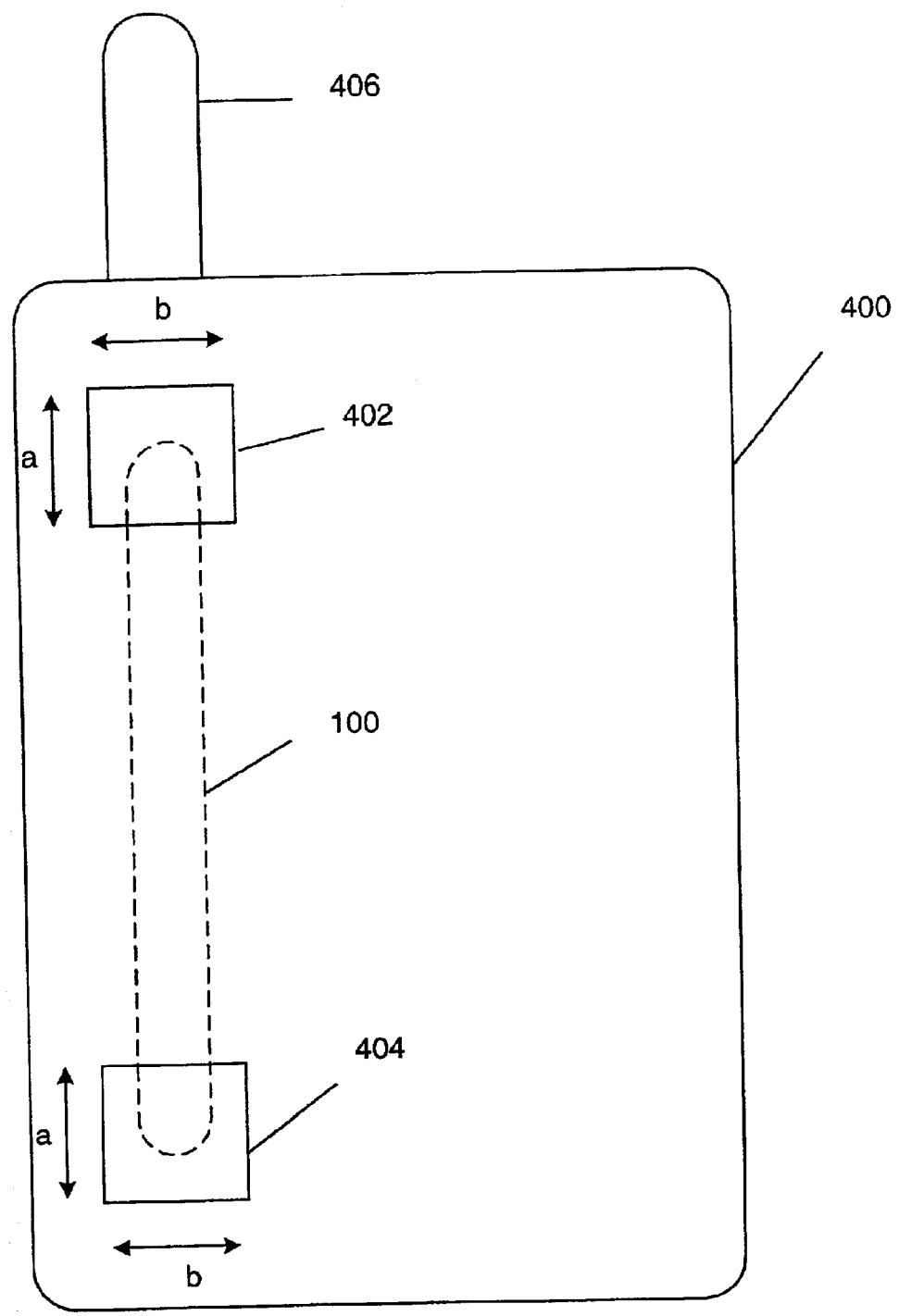
FIG. 4 is a diagram illustrating an exemplary mobile phone circuit board onto which the cable of FIG. 1 is placed using the nozzle of FIG. 2.

Because nozzle 200 does not directly align cable 100 in the x-axis, and no camera is used to align the cable along this axis, the solder pads on the circuit board are preferably configured to compensate for any x-axis misalignment. An example mobile phone circuit board 400 is illustrated in FIG. 4 that includes solder pads 402 and 404. As can be seen, one pad 402 is positioned near the location of the mobile phones antenna 406. Each pad 402 and 404 has a length dimension (a) and a width dimension (b). These dimensions can be increased or decreased slightly to compensate for any x or y-axis misalignment. For example, the width (b) can be slightly increased to correct for x-axis misalignment of cable 100. Similarly, if required, the length (a) can be increased to compensate for y-axis misalignment.

Thus, by combining some or all of the techniques described above, a conventional pick and place machine can be configured to accurately place cable 100 without the aid of a camera or the need for extra (and costly) manual steps.

Figure 5:
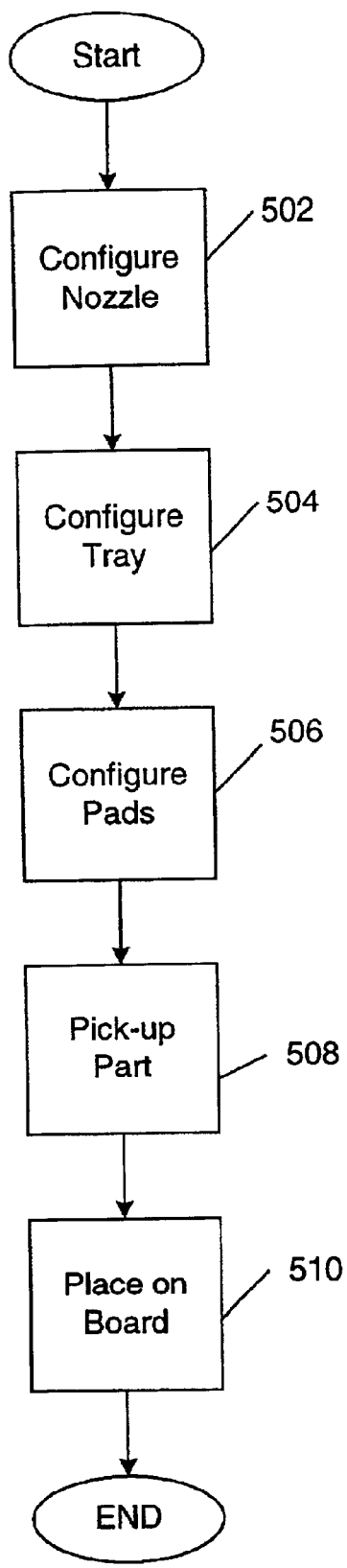
FIG. 5 is a flow chart illustrating one example embodiment of a process of placing the cable of FIG. 1 onto the board of FIG. 4 in accordance with the invention.

FIG. 5 is a flow chart illustrating the overall process for configuring such a machine to accurately place cable 100. In step 502, a nozzle is configured in accordance with the methods described herein. For example, in the case of a cable, the critical aspects and dimensions that must be considered when configuring the nozzle are described in detail above; however, the same concepts can be applied for any type of oddly shaped component that would otherwise require excess and/or hand operations to install on a circuit board.

Next, in step 504, the tray or reel that holds the oddly shaped components can be configured to hold the components in a precise location within the tray or reel. This was described above for the case of cable 100 above.

In step 506, the solder pads for the oddly shaped component can be configured to correct for any misalignment that may still exist. For example, the length and/or width of the pads can be adjusted to correct for x and/or y-axis misalignment.

In step 508, a conventional pick and place machine configured to use the nozzle from step 502 can then be used to pick up the oddly shaped parts and place them on circuit boards in step 510 without the aid of a camera or the need for costly extra steps.

Again, while the systems and methods described above were described in relation to placing a cable 100, the systems and methods described herein should not be seen as being limited to only cable placement. As was mentioned, the systems and methods described herein can be applied to any oddly shaped component that is not currently capable of accurate placement using a conventional pick and place machines. Thus, while embodiments and implementations of the invention have been shown and described, it should be apparent that many more embodiments and implementations are within the scope of the invention. Accordingly, the invention is not to be restricted, except in light of the claims and their equivalents.

What is claimed is:

1. A non-visual method for component placement in fabrication of circuit board the method comprising the steps of:

creating air suction through a hole in a nozzle depression;

in response to the air suction, drawing a component into the nozzle depression;

placing the nozzle over a circuit board region;

ceasing air suction through the nozzle hole; and, depositing the component on the circuit board region, the creating air suction through the hole in the nozzle depression comprises creating air suction through a nozzle depression having a first shape, the drawing the component into the nozzle depression comprises drawing a component having the first shape, the creating air suction through the nozzle depression having the first shape comprises creating air suction through a nozzle semicircular groove, the drawing the first-shaped component into the nozzle semicircular groove comprises drawing a coaxial cable component into the nozzle semicircular groove.

2. The method of claim 1, further comprising:

presenting a tray with the coaxial cable Provided at a first angle of axis rotation; and, wherein depositing the component on the circuit board region comprises depositing the coaxial cable, at the first angle of axis rotation, on the circuit board region.

3. The method of claim 2, further comprising:

following the drawing of the coaxial cable component into the nozzle semicircular groove, frictionally maintaining the coaxial cable angle of axis rotation in the groove.

4. The method of claim 1, further comprising:

providing a coaxial cable with a first end and a second end;

wherein drawing the component into the nozzle semicircular groove in response to the air suction comprises simultaneously drawing the cable first and second ends into the nozzle groove; and, wherein depositing the component on the circuit board region comprises simultaneously depositing the coaxial cable first and second ends on the circuit board region.

5. The method of claim 1, wherein depositing the coaxial cable component on the circuit board region comprises placing the coaxial cable on a mobile telephone circuit board solder pad adjacent a mobile telephone antenna.

6. The method of claim 1, wherein creating air suction through the nozzle semicircular groove comprises creating air suction through a nozzle semicircular groove having a first radius; and, wherein drawing the coaxial cable component comprises drawing a coaxial cable having a second radius, less than the first radius.

7. The method of claim 1, wherein creating air suction through the nozzle semicircular groove comprises creating air suction through a nozzle groove having at least a first length; and, wherein drawing the coaxial cable component comprises drawing a coaxial cable having the first length.

\* \* \* \* \*